(12) United States Patent
Tsukude

(10) Patent No.: US 6,721,225 B2
(45) Date of Patent: Apr. 13, 2004

(54) SEMICONDUCTOR MEMORY DEVICE WITH ACTIVATION OF A BURST REFRESH WHEN A LONG CYCLE IS DETECTED

(75) Inventor: Masaki Tsukude, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/252,565

(22) Filed: Sep. 24, 2002

(65) Prior Publication Data

US 2003/0185078 A1 Oct. 2, 2003

(30) Foreign Application Priority Data

Mar. 29, 2002 (JP) ........................................ 2002-096092

(51) Int. Cl.[7] ............................................. G11C 11/406
(52) U.S. Cl. ......................... 365/222; 365/149; 711/106
(58) Field of Search ................. 365/222, 149; 711/106

(56) References Cited

U.S. PATENT DOCUMENTS

| | | | |
|---|---|---|---|
| 5,321,662 A | | 6/1994 | Ogawa ........................ 365/222 |
| 5,583,818 A | * | 12/1996 | You et al. .................... 365/222 |
| 5,907,857 A | * | 5/1999 | Biswas ........................ 711/106 |
| 6,188,627 B1 | * | 2/2001 | Blackmon et al. .......... 365/222 |
| 2002/0178323 A1 | * | 11/2002 | Tsukude et al. ............. 711/106 |

FOREIGN PATENT DOCUMENTS

| | | |
|---|---|---|
| JP | 6-5074 | 1/1994 |
| JP | 6-111568 | 4/1994 |
| JP | 6-124587 | 5/1994 |
| JP | 10-199236 | 7/1998 |

* cited by examiner

Primary Examiner—Richard Elms
Assistant Examiner—J. H. Hur
(74) Attorney, Agent, or Firm—McDermott, Will & Emery

(57) ABSTRACT

A semiconductor memory device according to the invention has an active state where data can be read and written and a standby state where the data are retained. It has a memory cell array including a plurality of memory cells arranged in a matrix, and a refresh controller which refreshes data stored in the plurality of memory cells. In the refresh controller, a first refresh cycle generator generates a first refresh cycle, while a second refresh cycle generator generates a second refresh cycle having a period shorter than the first refresh cycle. A refresh processor performs refresh operation when the refresh operation becomes possible after the first refresh cycle and, when refresh operation is not performed for a longer period than the first refresh cycle, it performs refresh operations successively based on the second refresh cycle in the longer period or after the end of the longer period.

12 Claims, 15 Drawing Sheets

SEMICONDUCTOR MEMORY DEVICE WITH ACTIVATION OF A BURST REFRESH WHEN A LONG CYCLE IS DETECTED

BACKGROUND OF THE INVENTION

The invention relates to a semiconductor memory device, and in particular to a semiconductor memory device which can perform refresh operation independently of any signal received from the external.

An asynchronous static random access memory (hereinafter referred to as SRAM) which does not need external clocks is used widely for a portable terminal such as a mobile phone. Because a SRAM does not need refresh operation, a complex control for the refresh control is not necessary. Thus a system structure of a portable terminal can be simplified by using SRAMs. Therefore, a SRAM is suitable for a portable terminal.

Recently, a portable terminal is equipped with functions improved to a large degree, so that it is required to have a memory device of larger capacity. The memory cell size of SRAM is about ten times that of a dynamic random access memory (hereinafter referred to as DRAM). Therefore, when a SRAM of large capacity is used for a portable terminal, the cost of the chip is high largely, and this increases the price of the portable terminal. Because a DRAM has a lower cost per bit, it is suggested to use a DRAM, instead of a SRAM, for a portable terminal.

A DRAM has an active state wherein data can be read and written and a standby state wherein the data are retained, and it needs to maintain the stored state by refresh operation. Therefore, it needs a complicated memory control for refresh operation. Thus, it is not easy to adopt DRAMs instead of SRAMs for engineers in portable terminal manufacturers who have designed systems by using SRAMs as memory devices.

Then, a new semiconductor memory device has been developed actively that operates as a DRAM as a memory device, but as a SRAM as to the interaction with the external. Such a new semiconductor memory device is reported in KAZUHIRO SAWADA et al., IEEE JOURNAL OF SOLID-STATE CIRCUITS, Vol. 23, No. 1, FEBRUARY 1998, p12–19.

Memory cells in the new semiconductor memory device are the same as in a DRAM. On the other hand, the external interface thereof including control signals and address signals is about the same as that of a SRAM. Further, the refresh operation in the new semiconductor memory device is not controlled by an external signal, in contrast to the refresh operation or the self refresh operation in a prior art DRAM, and it is controlled by a refresh enable signal generated periodically by a refresh circuit inside the semiconductor memory device. The above-mentioned new semiconductor memory device can perform refresh operation independently of an external input signal. Therefore, it is called as DRAM having completely hidden refresh function. A refresh circuit includes a timer circuit as a ring oscillator, and it generates a refresh enable signal in correspondence to a cycle signal outputted periodically by the timer circuit. Because the timer circuit generates the cycle signal constantly, the new DRAM performs refresh operation periodically both in the active state and in the standby state. By developing the DRAM having completely hidden refresh function, new high functions can be added to a portable terminal.

However, because the new DRAM performs refresh operation both in the active state and in the standby state, a malfunction may happen when a refresh enable signal is activated at the same timing as a write or output enable signal. This is explained below.

FIG. 1 is a timing chart when a malfunction may happen in a DRAM having completely hidden refresh function. Chip enable signal /CE is a control signal received from the external. (Hereinafter, a signal having "/" appended at the top thereof denotes a negative logic signal.) When chip enable signal /CE is active, the DRAM is in the active state, while when inactive, it is in the standby state. In the timing chart shown in FIG. 1, in the standby state until time t4, chip enable signal /CE is inactive ("H" level). Thus, the DRAM is in the standby state, and at times t1 and t3, refresh enable signal /REFE is activated in correspondence to the activation of refresh cycle signal /Refcyc so that refresh operation is performed. On the other hand, at time t2 when refresh cycle signal /Refcyc is inactive so that refresh operation is performed. Next, at time t4, chip enable signal /CE becomes the active state ("L" level), the DRAM becomes the active state. Therefore, for example at time t5 when refresh enable signal /REFE is activated, a signal for requesting write or read may be received from the external. In such a case, the DRAM is liable to function erroneously.

In order to prevent such a malfunction, a prior art DRAM having completely hidden refresh function has an arbitration circuit. The arbitration circuit compares refresh enable signal /REFE as a synchronization signal with a request signal for write or read to control the order of the operation. In the concrete, when refresh enable signal /REFE and a request signal for write or read are activated at the same timing, the arbitration circuit makes the operation for the signal activated earlier start first and the operation of the other signal start next. Thus, when the two signals are activated at the same time, the malfunction of the DRAM can be prevented to some degree.

However, when the arbitration circuit controls to perform write or read after refresh operation, the access rate is liable to be decreased to a large extent. Further, when refresh enable signal /REFE and a request signal for write or read are activated at absolutely the same timing, the arbitration circuit cannot perform arbitration.

Therefore, it is difficult that the prior art DRAM having completely hidden refresh function secures the stability of refresh operation.

SUMMARY OF THE INVENTION

An object of the present invention is to secure the stability of refresh operation in a semiconductor memory device having an active state where data can be read and written and a standby state where the data are retained.

A semiconductor memory device according to the invention has an active state wherein data can be read and written and a standby state wherein the data are retained. The semiconductor memory device has a memory cell array including a plurality of memory cells arranged in a matrix, and a refresh controller which refreshes data stored in the plurality of memory cells. In the refresh controller, a first refresh cycle generator generates a first refresh cycle, while a second refresh cycle generator generates a second refresh cycle having a period shorter than the first refresh cycle. A refresh processor performs refresh operation when the refresh operation becomes possible after the first refresh cycle and, when refresh operation is not performed for a period longer than the first refresh cycle (long period), it performs refresh operations successively based on the second refresh cycle in the long period or after the long period.

Thus, when it is not a long cycle or when high speed refresh operation is necessary, refresh operation can be performed at high speed cycle, while when it is a long cycle, refresh operation can be performed automatically in a necessary time. In a long cycle, the device can be operated stably without destroying data. Preferably, a detector in the refresh processor detects that refresh operation is not performed for the long period. Preferably, the detector comprises a counter which counts the first refresh cycle when refresh operation is requested. The long period is detected when the counter counts the first refresh cycle more than a predetermined times. Thus, the long period can be recognized automatically in a simple structure.

An advantage of the present invention is that when refresh operation is not performed for a long period, refresh operation can be performed automatically in a necessary time stably without destroying data.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
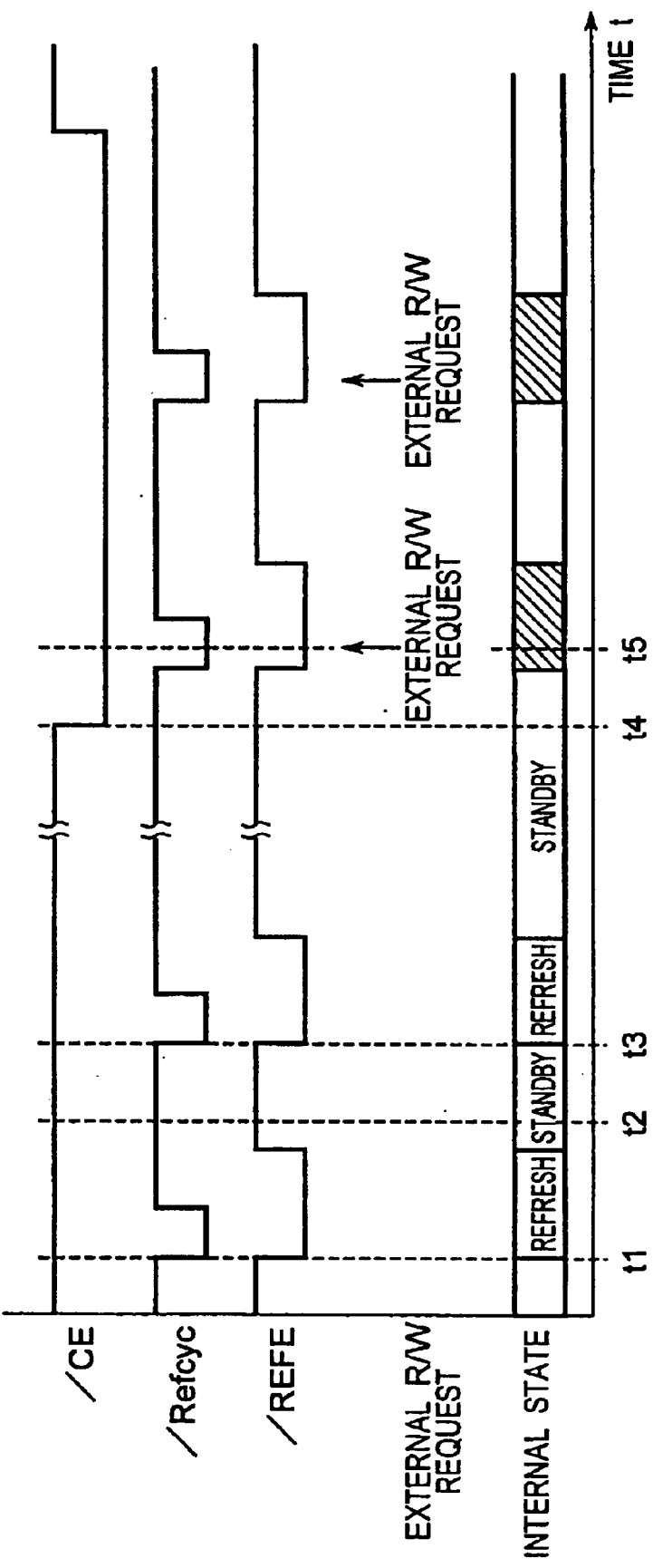
FIG. 1 is a timing chart for explaining a malfunction in a prior art dynamic random access memory.

Embodiments of the invention are explained below by referring now to the drawings, wherein like reference characters designate like or corresponding parts throughout the several views.

A semiconductor memory device according to the invention has an active state wherein data can be read and written and a standby state wherein the data are held. In the active state, data can be read from and written to a memory cell array including memory cells arranged in a matrix. The memory cells are similar to those in a DRAM and refresh operation is needed therefor. Inside the semiconductor memory device, a clock cycle representing a period for generating a refresh signal is generated, and the clock cycle defines an internal refresh cycle time. Data in the memory cells are held by performing refresh operation once in an internal refresh cycle time. The semiconductor memory device performs refresh operation independently of any input signal from the external.

Figure 2:
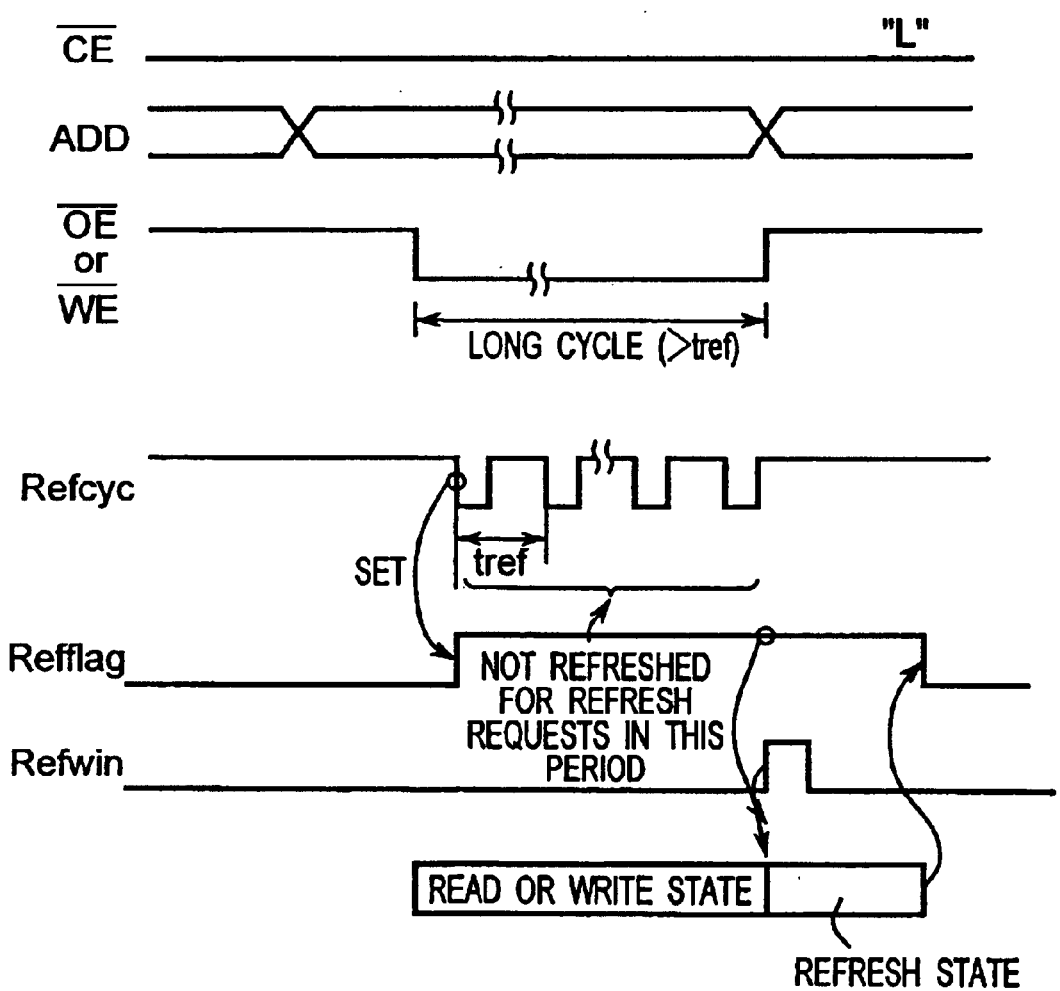
FIG. 2 is a timing chart for explaining relationship between a long cycle and refresh operation.

In order to secure stability of refresh operation in such a semiconductor memory device which performs refresh operation independently of any input signal from the external, the inventor already proposed to perform refresh operation according to a state of the semiconductor memory device. The state of semiconductor memory device is, for example, the standby state, or a state after read or write operation is completed. However, the semiconductor memory device has a problem that it cannot be operated in a period longer than the internal refresh cycle time, for example a few tens microseconds. Such a period is referred to as "long cycle". FIG. 2 shows an example wherein refresh operation is not performed in a long cycle when the chip is enabled (/CE="L") in a semiconductor memory device wherein refresh operation is performed after read or write operation. In this example, the read or write state continues in a period longer that the internal refresh cycle time tref, and no refresh operation is performed. Then, refresh operation is performed at the leading edge of refresh period signal Refwin="H", but because read or write operation has not been performed in a long time, the data were destroyed. Similarly, in a semiconductor memory device of address trigger type wherein the rows of the memory cell array are controlled according to a change in address, the data are destroyed when the address is not changed for a long time when /CE="L" because there is no trigger point to activate refresh operation. Therefore, in the specification on the interface with the external, there is no condition on the cycle of /CE="H", but when /CE="L", a condition is needed that a read or write operation or a change in address has to be performed within the internal refresh cycle time.

Then, according to the invention, a semiconductor memory device wherein refresh operation can be performed independently of any input signal from the external can be used in a cycle longer than the internal refresh cycle time without destroying data. A refresh controller has a first circuit which generates a normal (first) refresh cycle and another circuit which generates a (second) refresh cycle having a faster cycle. Refresh operation is performed based on the first refresh cycle when not in a long cycle or when high speed access is necessary. On the other hand, when the cycle is longer than the internal refresh cycle time, the refresh controller automatically performs continuous refresh operation based on the second refresh cycle, and the number of refresh operation is a number of the internal refresh cycle times which have been skipped (hereinafter this is referred to as burst refresh). As mentioned above, the semiconductor memory device can control the refresh operation independently of a signal received from the external. Therefore, it is not necessary to limit the specification on the interface with the external. In the embodiments explained below a long cycle can be detected automatically, but it is also possible to detect a long cycle outside the semiconductor memory device and to send the detection result thereto. In this case, the semiconductor memory device can perform refresh control according to the detection result.

First Embodiment.

Figure 3:
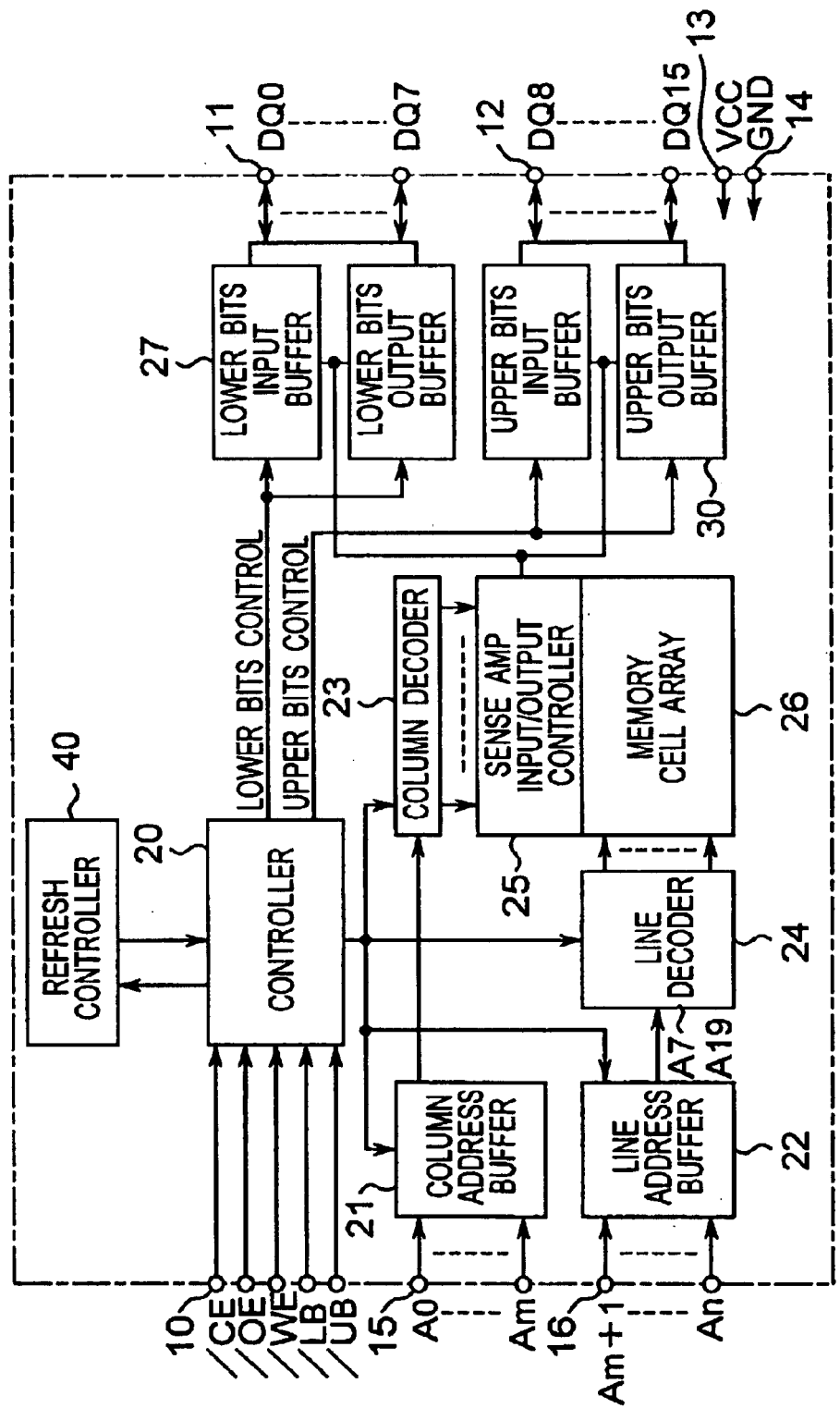
FIG. 3 is a block diagram of a dynamic random access memory of a first embodiment of the invention.

FIG. 3 shows an entire structure of a semiconductor memory device (DRAM) which does not need external refresh control according to a first embodiment of the invention. In the semiconductor memory device, a memory cell array 26 has a plurality of DRAM cells. Control pins similar to those of a SRAM are provided as external pins 10–17. The device has an input pin group 10 for receiving chip enable signal (/CE), output enable signal (/OE), write enable signal (/WE) and control signals (/LB, /UB), a pin group 11 for lower bit data signals $DQ_0$-$DQ_7$, another pin group 12 for lower bit data signals $DQ_8$-$DQ_{15}$, a further input pin group 15 for column address signal $A_o$-$A_m$ (wherein m is a natural number larger than one), a different input pin group 16 for address signal $A_{m\times 1}$-$A_n$ (wherein n is a natural number larger than one), a power source pin 13 for applying power source voltage $V_{cc}$ and a ground pin 14 for the ground voltage GND. In contrast to a conventional DRAM, the address is not given by time-sharing. Refresh operation is performed after read or write operation. A refresh controller 40 is further provided to control refresh operation without external control, and the refresh operation is performed based on refresh enable signal /REFE outputted by the refresh controller 40. Thus, external refresh control is not needed.

In the DRAM, in response to a control signal received from the pin group 11, a controller 20 outputs a control clock to a relevant block in correspondence to an operation mode thereof such as write mode or read mode. The control signals are explained here. Chip enable signal /CE enables the chip (or DRAM device). Output enable signal /OE sets read mode for the DRAM and enables output buffers. Write enable signal /WE sets write mode for the DRAM. Control signal /LB selects data input/output through the data pin group 11 of lower bits, and control signal /UB selects data input/output through the data pin group 12 of upper bits. The structure of the controller 20 is similar to that of a conventional DRAM except the refresh control.

A column address buffer 21 receives and sends address signal $A_o$-$A_m$ to the inside according to the output of the controller 20. A row address buffer 22 receives and sends address signal $A_{m+1}$-$A_n$ to the inside according to the output of the controller 20. A column decoder 23 receives an internal address signal sent by the column address buffer 21 according to the output of the controller 20 and sets a column address, while a row decoder 24 receives an internal address signal sent by the row address buffer 22 according to the output of the controller 20 and sets a row address. A memory cell array 26 consists of a plurality of memory cells arranged in a matrix. A sense amplifier and an input/output controller 25 writes and amplifies data to the memory cell array 26 and reads an output data from the memory cell array.

Further, a lower bits input buffer 27 receives data $DQ_0$–$DQ_7$ from the pin group 11 according to the output of the controller 20 and sends it to the sense amplifier and an input/output controller 25. A lower bits output buffer 28 receives a signal from the sense amplifier and an input/output controller 25 and sends data signal to the pin group 11 according to the output of the controller 20. An upper bits input buffer 29 receives data $DQ_8$–$DQ_{15}$ from the pin group 12 according to the output of the controller 20 and sends it to the sense amplifier and an input/output controller 25. An upper bits output buffer 30 receives a signal from the sense amplifier and an input/output controller 25 and sends data signal to the pin group 12 according to the output of the controller 20.

A refresh controller 40 controls the refresh operation without external refresh control. The refresh controller 40 sends refresh enable signal /REFE, a signal activated periodically, to the controller 20. Then, the controller 20 sends instruction signals to the relevant blocks for the refresh operation. The refresh controller will be explained below in detail.

Figure 4:
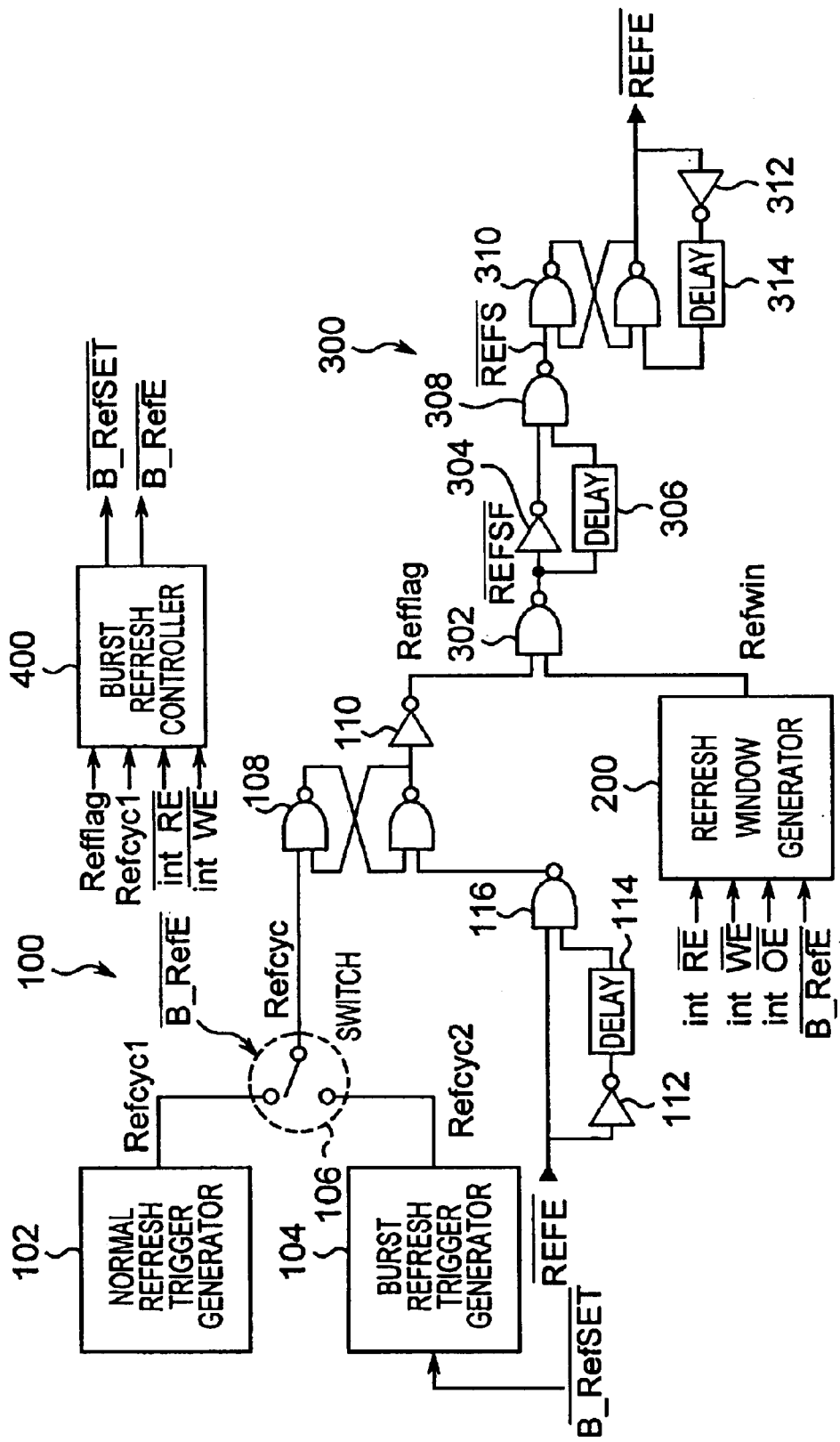
FIG. 4 is a circuit diagram of a refresh controller of the first embodiment.

FIG. 4 shows a structure of the refresh controller 40. A refresh flag generator 100 generates a signal (refresh flag Refflag) which represents a request for refresh operation from the inside of the chip. (The refresh flag Refflag of "H" level means that refresh is requested.) A refresh window generator 200 generates refresh window signal Refwin which represents a window or period wherein refresh operation is possible. A circuit 300 generates refresh enable signal /REFE which controls refresh enable based on two signals of refresh flag Refflag and refresh window signal Refwin. A burst refresh controller 400 controls burst refresh for executing refresh operations together successively a plurality of times when a long cycle is recognized, and it generates burst refresh enable signal B__RefE.

Figure 5:
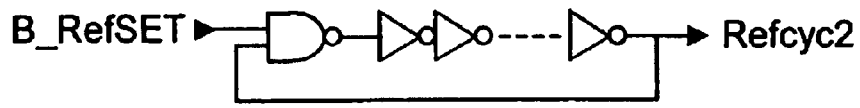
FIG. 5 is a circuit diagram of a burst refresh generator.

The refresh flag generator 100 has a normal refresh trigger generator 102 and a burst refresh trigger generator 104. The normal refresh trigger generator 102 includes a ring oscillator which generates refresh cycle (Refcyc1) of a predetermined period in normal time, while the burst refresh trigger generator 104 generates refresh cycle (Refcyc2) for burst refresh wherein refresh operations are performed successively in a certain period. Refresh cycle, Refcycl, corresponds to refresh cycle (internal refresh cycle time) in a conventional DRAM. The burst refresh trigger generator 104 has a structure as shown in FIG. 5, and it is a ring oscillator which cycles in a period shorter than that of the normal refresh timer. Further, a control function is added so as not to oscillate the ring oscillator in modes other than burst refresh (B__RefSET="H") for lower consumption power. A switch 106 selects one of the periods outputted by the two refresh trigger generators 102, 104. Which period is selected depends on burst refresh enable signal /B__RefE generated by the burst refresh controller 400. When /B__RefE is activated, the period of the second refresh trigger generator 104 is selected. Based on the refresh cycle signal Refcyc selected by the switch 106, refresh flag Refflag is generated through a flip flop 108 and an inverter 110. Further, when refresh operation is completed, refresh flag Refflag is disabled. Thus the refresh enable signal /REFE is stopped to be outputted, and the generation of refresh flag is stopped after delay of a predetermined time. That is, the refresh enable signal /REFE itself and a signal obtained by transmitting /REFE signal through an inverter 112 and a delay circuit 114 are sent to a NAND gate 116, so that the output thereof resets the flip flop 108.

The starting point of refresh operation is a timing when both of refresh flag Refflag set by refresh cycle signal Refcyc and refresh window signal Refwin are enabled. In a circuit 300 which generates refresh enable signal /REFE, both of refresh flag Refflag, set by refresh cycle signal Refcyc in the refresh flag generator 100, and refresh window signal Refwin, generated by the refresh window generator 300, are sent to a NAND gate 302. The output signal of the NAND gate 302 is sent to an inverter 304 directly or via a delay circuit 306 and further to a NAND gate 308 which outputs refresh start signal /REFS. The signal is outputted through a flip flop 310 as refresh enable signal /REFE. Refresh operation is performed according to the output of refresh enable signal /REFE. The signal /REFE is inverted by an inverter 312 and is delayed by a delay circuit 314 by a refresh operation period. Then, it is sent to a flip flop 310 and reset after a predetermined time.

Figure 6:
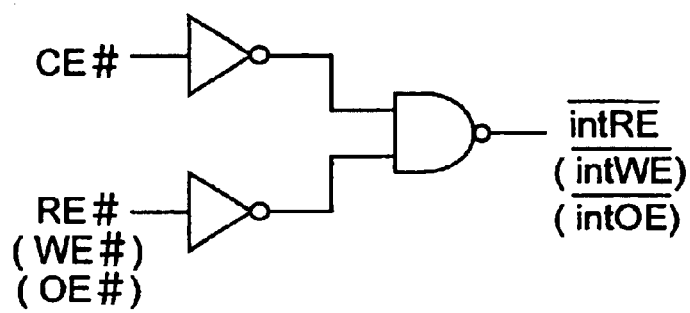
FIG. 6 is a circuit diagram for generating signals int/RE, int/WE and int/OE.

FIG. 6 shows a circuit which generates internal read enable signal, int/RE (or internal write enable signal, internal output enable signal int/OE). When external chip enable signal CE# and write enable signal RE# (or write enable signal WE# or output enable signal OE#) are both at "L" level, the signal inverted by the inverter is sent to the NAND gate to generate int/RE (or int/WE, int/OE). The controller 20 sends int/RE, int/WE or int/OE signal to the refresh controller 40.

Figure 7:
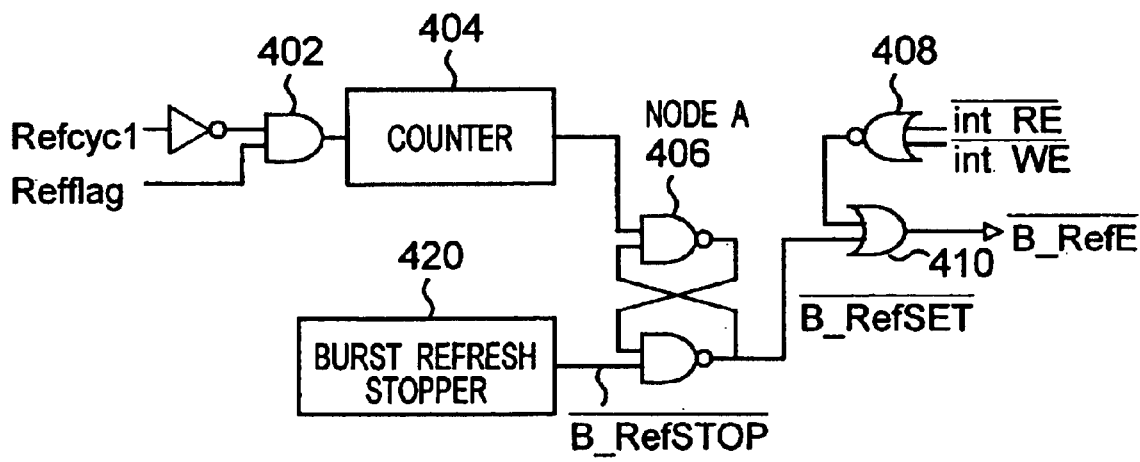
FIG. 7 is a circuit diagram of a burst refresh controller.
Figure 8:
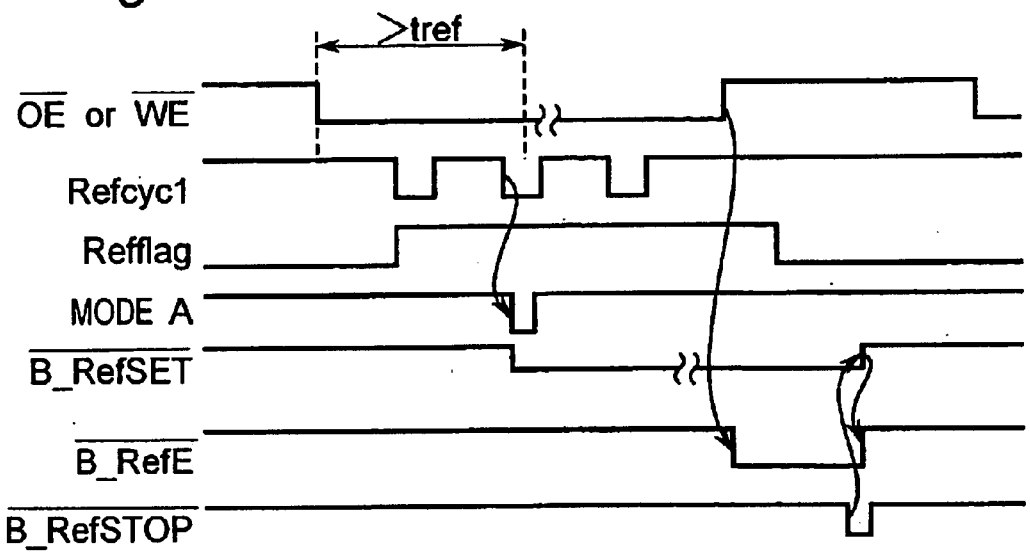
FIG. 8 is a timing chart of the burst refresh controller.

FIG. 7 shows a structure of the burst refresh controller 400. The burst refresh controller 400 consists of a circuit for setting burst refresh when a long cycle is detected automatically and a burst refresh stopper which detects the completion of burst refresh. The automatic detection of long cycle realized by using the principle explained below with reference to a timing chart of FIG. 8. As explained above, the starting point of refresh operation is a time when both of refresh flag Refflag, set according to refresh cycle Refcyc, and refresh window signal Refwin, on a period wherein refresh operation is possible, are activated, and it is inactivated when the refresh operation is completed. A long cycle occurs, for example, when a write state continues for a period longer than a normal refresh cycle, so that it can be recognized by counting Rercyc1 twice or more. When Refflag is activated (Refflag="H" level), the AND gate 402 outputs an inverted signal of Refcyc1, and it is counted by a counter 404. When the counter 404 counts twice or more, the occurrence of a long cycle is recognized. Then, at the stage, the flip flop 406 is set to output burst refresh set signal /B_RefSET. Then, when the NOR gate 408 sends a signal representing that internal signal int/RE or int/WE is not outputted, or when read or write is not enabled in a long cycle, burst refresh enable signal B_RefE is outputted through the OR gate 410. Thus, refresh window signal Refwin is enabled and burst refresh is performed. On the other hand, when the refresh operations are performed as many times as skipped normal refresh operations, the burst refresh stopper 420 recognizes the burst refresh is completed and sends reset signal to the flip flop.

Figure 9:
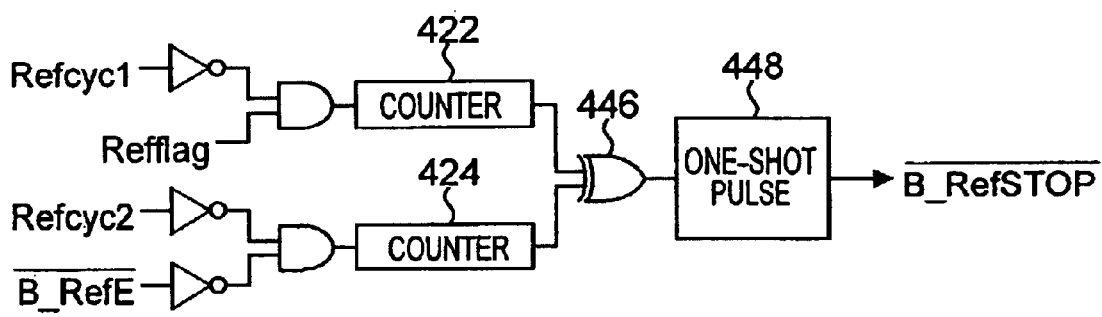
FIG. 9 is a circuit diagram of a burst refresh stopper.

As shown in FIG. 9, the burst refresh stopper 420 which detects completion of burst refresh has a counter 422, which counts the times of normal refresh cycles (Refcyc1) when Refflag is activated (Refflag="H" level), and another counter 424 which counts times of refresh operations based on fast refresh cycles (Refcycle2) when burst refresh is started. When the counts of the two counters agree with each other, an EXOR gate 426 activates a one-shot pulse circuit 428 to generate stop signal /B_RefSTOP for stopping burst refresh. Thus, refresh operations are performed repetitively together for times of the skipped normal refresh cycles (counted by the counter 422), in a long cycle (when /OE or /WE is not enabled) or after the long cycle is completed.

Figure 10:
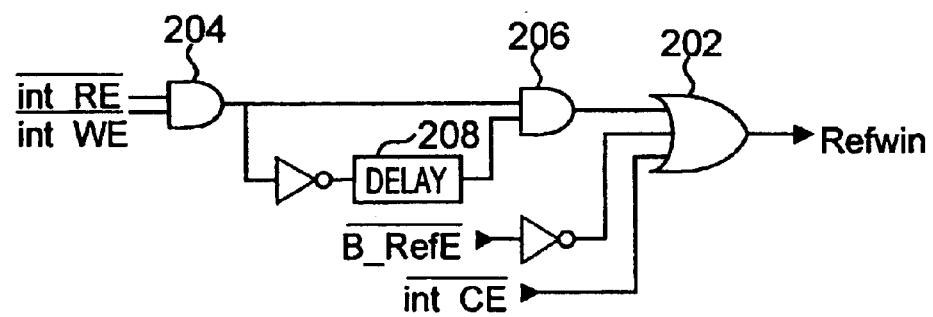
FIG. 10 is a circuit diagram of a refresh period generator.

FIG. 10 shows a structure of the refresh window generator 200. When int/CE="H" level, the refresh window signal Refwin is constantly activated by the OR gate 202. Further, when int/CE="L" level, the refresh window signal Refwin is activated by the OR gate 202 in a burst refresh period (/B_RefE="L" level). Further, both int/RE and int/OE are not enabled (or the output signal of the AND gate 204 is "H" level), the refresh window signal Refwin is enabled by delaying a certain time by the delay circuit 208 at the AND gate 206 and it is outputted through the OR gate 202. Thus, the refresh window signal Refwin is enabled in a long cycle or after completion of the long cycle. Then, burst refresh is activated.

Figure 11:
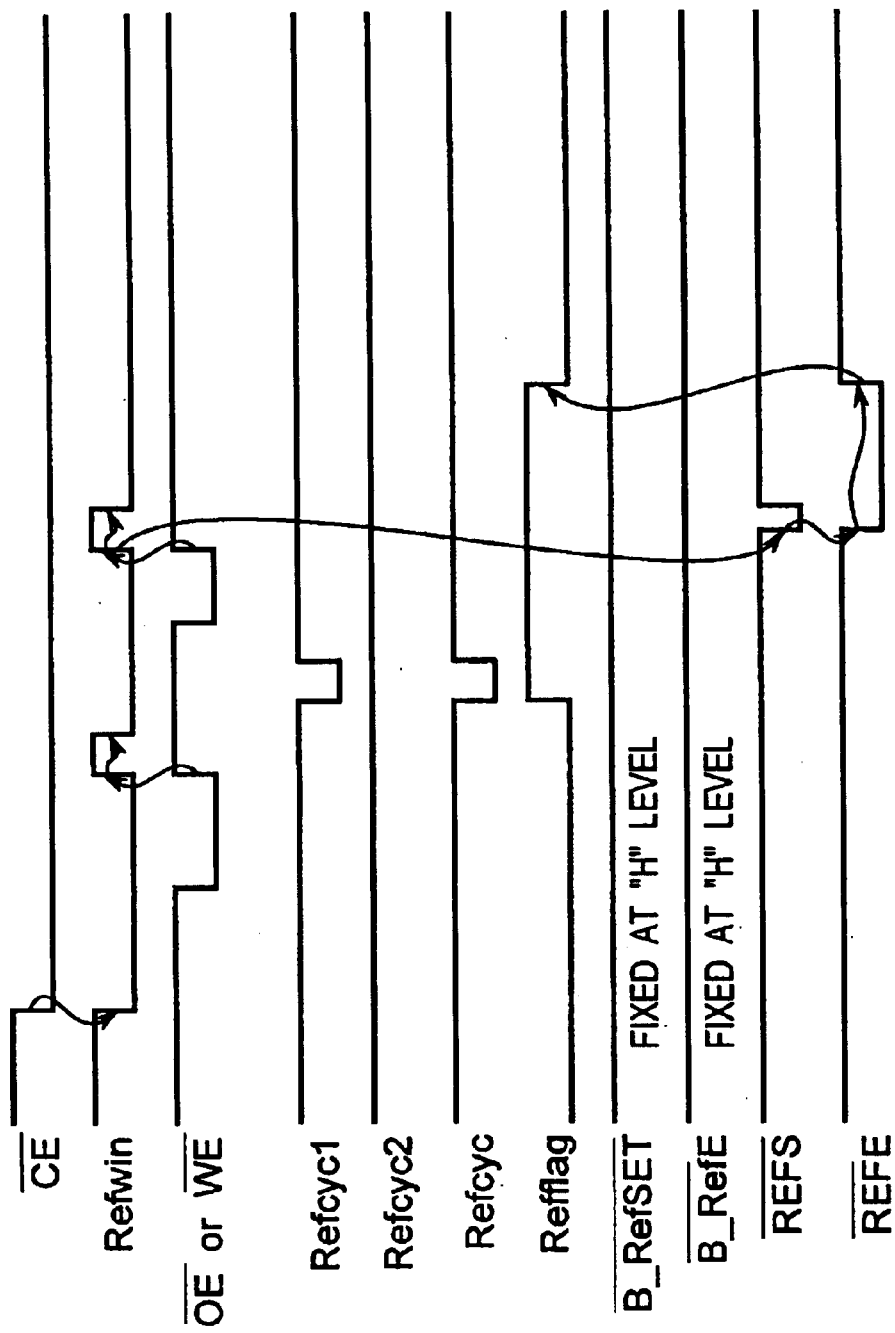
FIG. 11 is a diagram of the operation of the refresh controller for a normal cycle.

Next, the function of the semiconductor memory device having the above-mentioned circuit structure is explained in detail. With reference to FIG. 11, the operation of the refresh controller 40 is explained when refresh operation is performed in a normal cycle much shorter than the normal refresh cycle. A refresh cycle signal Refcyc1 is generated by the normal refresh trigger generator 102 at a predetermined period, and based on the signal, the refresh flag generator 100 activates refresh request signal Refflag. Further, after completion of read or write operation requested by an external signal, the refresh window generator 200 activates refresh window signal Refwin representing a period when it is confirmed whether the refresh flag is activated or not. Based on a timing when both signals, Refwin and Refflag, are activated, the refresh controller 300 generates refresh start signal /Refs, based on which refresh enable signal /REFE is generated. Because it is not recognized to be a long cycle, burst refresh enable signal is not activated. Thus, REfcyc2 is not generated, and conventional operation is performed.

Figure 12:
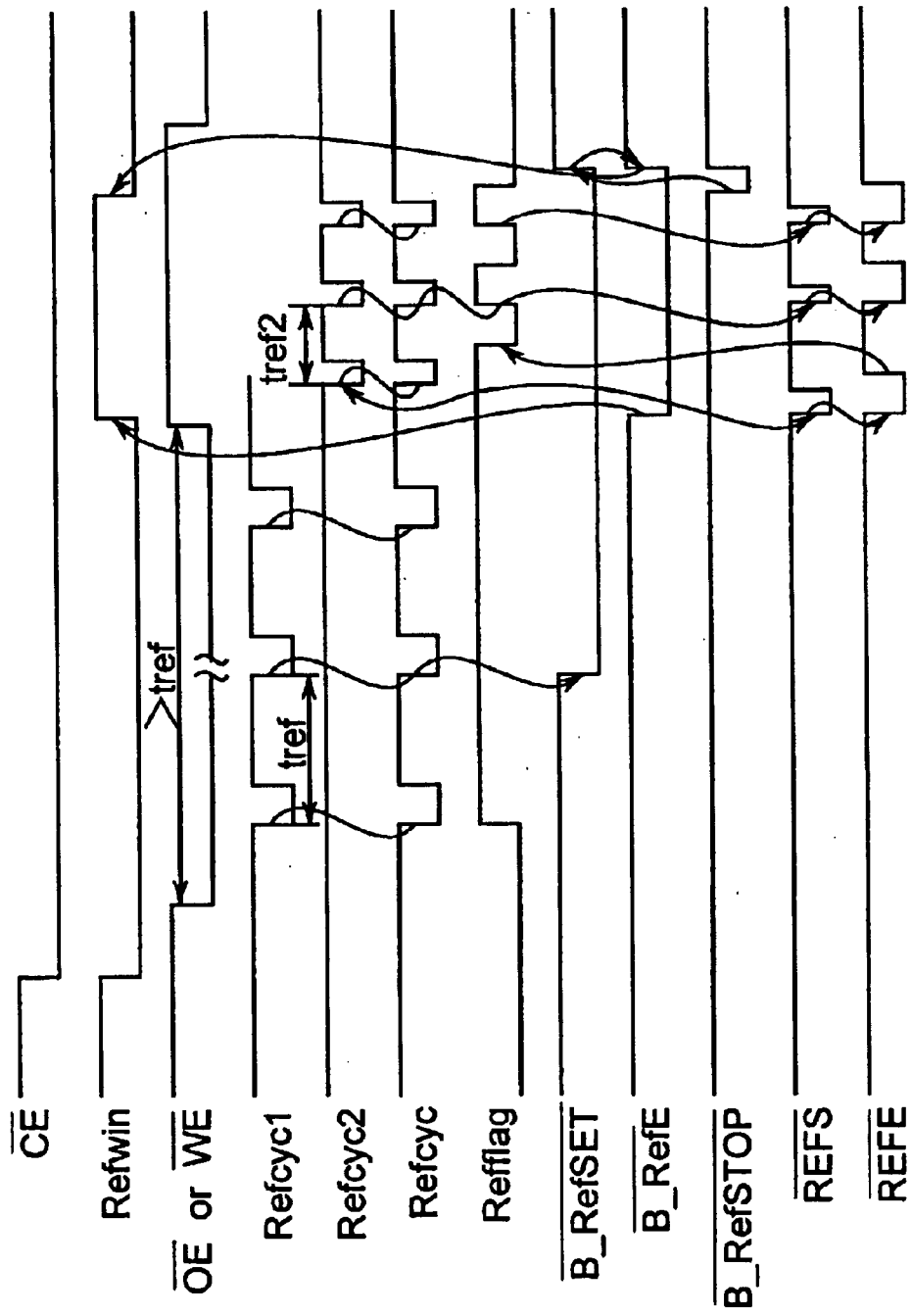
FIG. 12 is a diagram of the operation of the refresh controller for a long cycle.

Next, with reference to FIG. 12, the processing is explained when the read or write operation is performed in a long cycle longer than the normal refresh cycle (/CE="H", and the row system is controlled by /OE or /WE). When /OE or /WE is fixed at "L" level for a long time, the refresh window signal Refwin is not activated. Therefore, when the burst refresh controller 300 detects that Refcyc is counted twice or more in a state where Refflag is activated or it detects a long cycle, burst refresh set signal /R_RefSET is activated. However, at this stage, burst refresh is not performed. When /OE or /WE becomes "H" level, burst refresh enable signal /B_REfE is activated to start burst refresh. Further, the number of Refcyc1 is counted when Refflag is "H" level, and the counting is stopped when /OE or /WE becomes "H" level or read or write is stopped. When burst refresh enable signal /B_RefE is enabled, the period of refresh is changed from Refcyc1 to Refcyc2. At this time, refresh window period signal Refwin is activated, and refresh operation is performed in a shorter time in synchronization with Refcyc2 (much shorter than normal REfcyc1) as many as the times of skipped refresh operations when /OE or /WE is "H" level. Because the refresh operations are performed in a period when /OE or /WE is "H" level. Therefore, when /OE or /WE becomes "L" level thereafter, normal read or write operation is performed, and the next cycle is without delay for access, or it is performed smoothly. Thus, the problem is solved that the refresh cannot be performed in a long cycle longer than the internal refresh cycle time REfcyc1.

Second Embodiment

In the above-mentioned first embodiment, burst refresh is performed when /OE or /WE is "H" in a long cycle or when the long cycle is completed, for a semiconductor memory device wherein the row system in the memory cell array 26 is controlled according to a trigger of external /OE or /WE. This is equivalent with that the burst refresh is performed when the row system in the semiconductor memory device is not active. Therefore, instead of the trigger of /OE or /WE, a different signal which the inside of the semiconductor memory device is not active can be used. In the second embodiment, burst refresh in a long cycle is realized in a semiconductor memory device of address trigger type wherein the row system of the memory cell array 26 is controlled according to a change in address.

Figure 13:
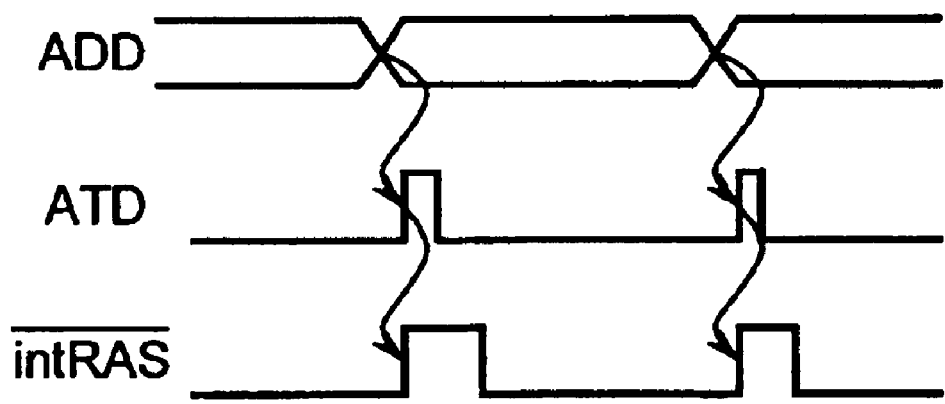
FIG. 13 is a diagram on generation of refresh period signal in an address trigger technique.

When the row system is controlled according to an address trigger, reset signal is generated at the trailing edge of signal /ATD generated by detecting a change in address ADD, so as to reset the row system in the preceding cycle, while set signal is generated at the leading edge of signal /ATD so as to activate the row system for an address set at the time. Internal row address strobe signal int/RAS is generated according to the two relationships. The row system is enabled or disabled in a period when int/RAS is "L" level or "H" level. Further FIG. 13 shows generation of the signal int/RAS in the controller 20. At the leading edge of /ATD signal generated when address signal is changed, signal int/RAS is generated. The controller 20 sends the signal int/RAS to the refresh controller 40. The structure of the refresh controller 40 is similar to that of the burst refresh controller (FIG. 4) in the first embodiment, except the burst refresh window generator 200. In the refresh window generator 200, in contrast to the circuit shown in FIG. 10, signal int/RAS is inputted instead of the output signal of the NAND gate 204. Refresh flag Refflag is activated for a predetermined time at the leading edge of signal int/RAS.

Figure 14:
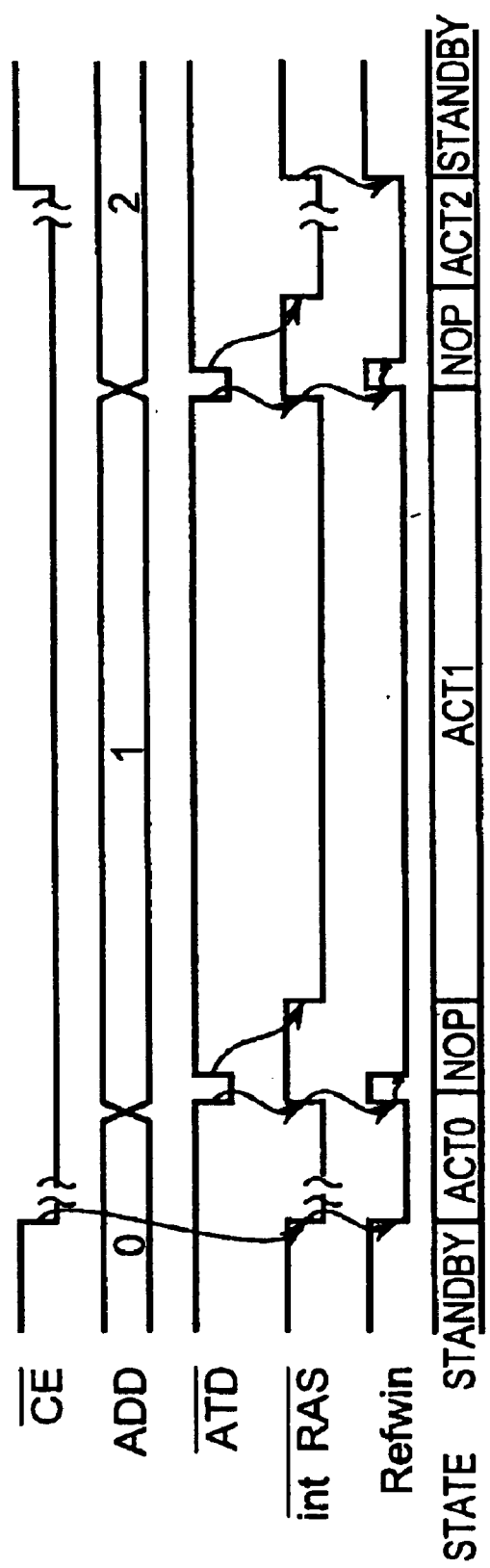
FIG. 14 is a circuit diagram for generating the signal int/RAS.

In the address trigger type device, refresh window signal Refwin is kept enabled when /CE="H". Then, when refresh flag Refflag is activated in synchronization with refresh cycle Refcyc, refresh enable signal /REFE is enabled readily based on the refresh flag, to perform refresh operation. Further, as shown in the timing chart of FIG. 14, when /CE="L" level, refresh window signal Refwin is enabled in a short period at the leading edge of int/RAS, and if Refflag is activated at this time, refresh operation is performed.

In order to perform refresh operation for the address trigger type device even when address is not changed for a long time when /CE="L" level, similarly to the first embodiment, the burst refresh controller 400 detects automatically that address change does not occur in a period longer than one internal refresh cycle when /CE="L" level. Then, it performs burst refresh in a period when /OE or /WE is "H" level. However, if the row system is controlled by an address trigger, signal /OE or /WE is not relevant to the control of the row system. Therefore, if burst refresh is performed after waiting that the row system becomes disabled according to address change (int/RAS="H" level), when /OE or /WE rises already before address change occurs, access is late.

Figure 15:
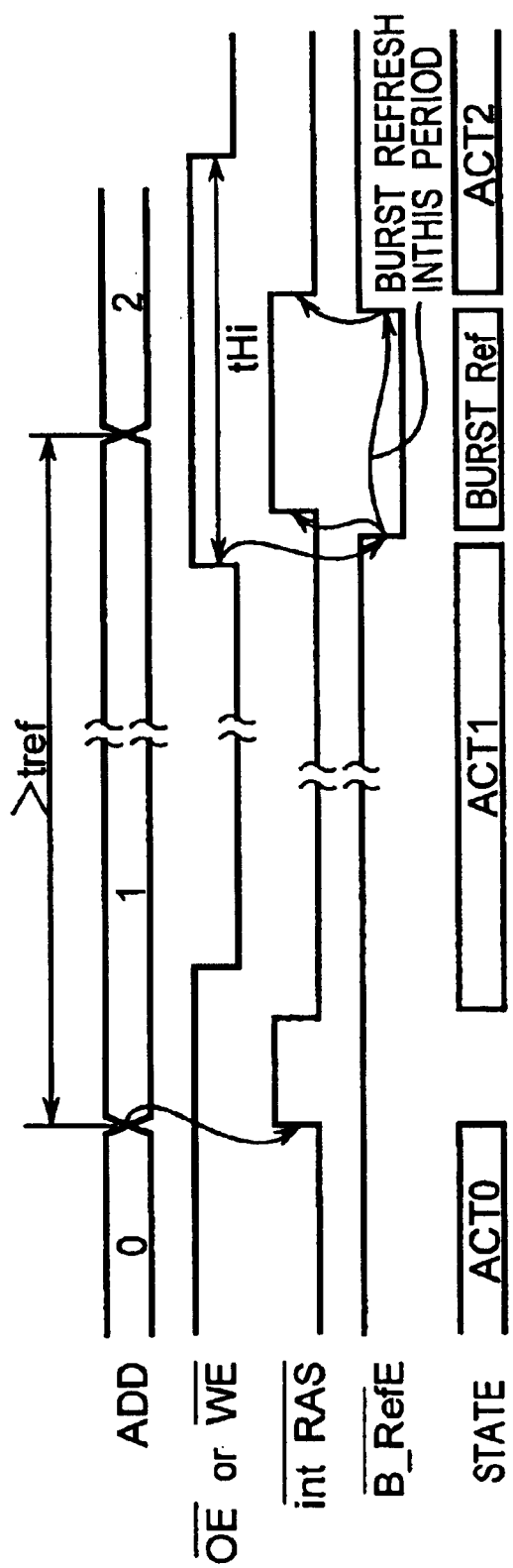
FIG. 15 is a timing chart on refresh operation for a long cycle in address trigger technique.

In order to solve this problem, as shown in the timing chart in FIG. 15, when burst refresh for a long cycle is recognized to be needed (or when burst refresh enable signal /B_RefE is enabled), the refresh controller 40 resets the row system even in a long cycle, irrespective of address change, at the leading edge of signal /OE or /WE, and burst refresh is started thereafter (burst refresh enable signal /B_RefE= "L" level). Thus, when /OE or /WE is enabled before address change, refresh operation after the address change is accelerated. Further, because the row system is disabled irrespectively of address change, if address change does not occur after burst refresh is completed, the row system is not active. Thus, address is not changed and /OE or /WE continues, so that the row system is not enabled. Then, the memory cell array 26 cannot be accessed. Then, in this embodiment, the row system is enabled automatically after completion of burst refresh. By using this technique, high speed access for the next cycle is realized.

Third Embodiment

In the above-mentioned second embodiment for the address trigger type DRAM, burst refresh is performed in a long cycle when external /OE or /WE is "H" level. In the period when external /OE or /WE is "H" level, refresh operation of times as many as the refresh cycles skipped in the long cycle has to be performed. Thus, the period has to be long to a certain extent. If the long cycles continue very long, the burst refresh has to be performed for each long cycle. However, for an abrupt long cycle, data would not be destroyed even if burst refresh is not performed.

Figure 16:
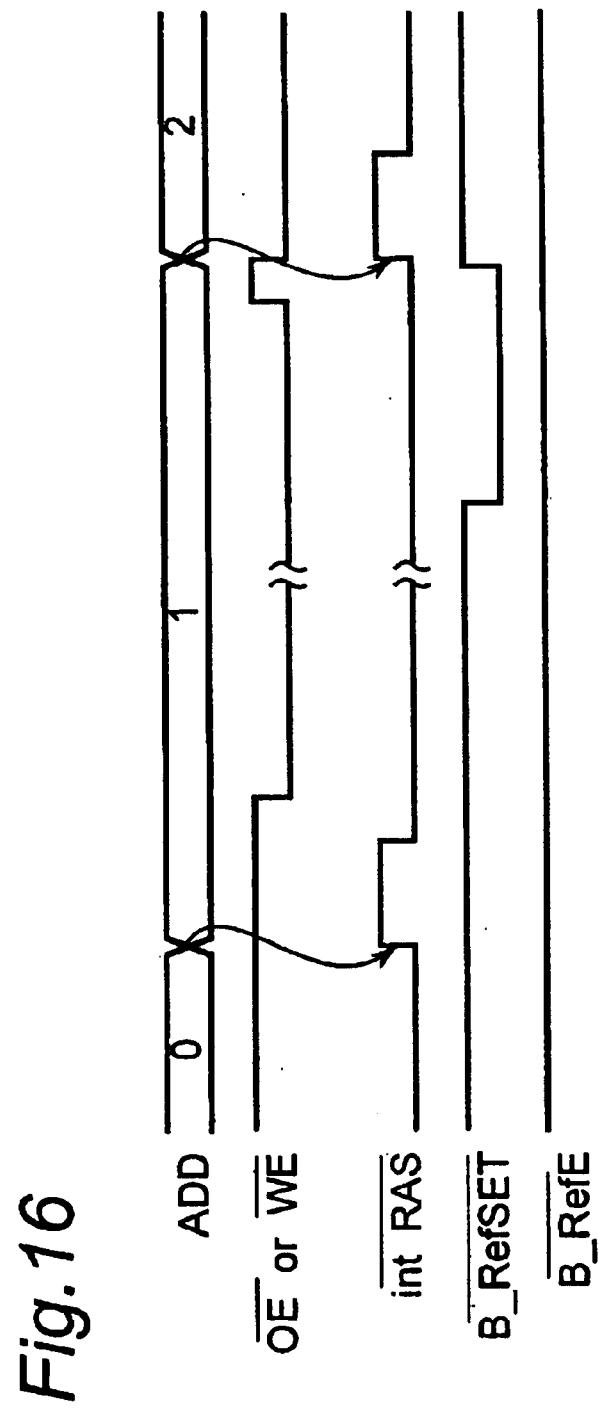
FIG. 16 is a timing chart on refresh control when the period of "H" level of /OE or /WE after a long cycle is shorter than a predetermined period.

Then, in the third embodiment, as shown in the timing chart in FIG. 16, for a one-shot long cycle, if burst refresh is recognized to be necessary (burst refresh set signal /B_RefSET is activated), burst refresh is not performed when the period of /OE or /WE of "H" level is set short. That is, if a long cycle is recognized but external /OE or /WE becomes "H" level (disable) in a shorter time than a predetermined time. In FIG. 16, burst refresh set signal /B_RefSET is set when a long cycle is recognized, but it is reset at the trailing edge of /OE or /WE because the period of "H" level of external /OE or /WE is shorter than a predetermined time. It is a problem that once burst refresh operation is started, read/write is not possible until the burst refresh is completed, and this causes delay of access. This embodiment can avoid this problem, and high speed after a long cycle is realized without destroying data.

The structure of the refresh controller 40 is similar to that of the first embodiment (FIG. 4) except a burst refresh controller 400. In contrast to the circuit shown in FIG. 7, the output signal from the flip flop 406 in the burst refresh controller 400 sends signal /B_RefSET to the OR gate as burst refresh start signal /B_REF when the period of "H" level of external /OE or /WE is shorter than a predetermined time. A counter which counts clock cycles in the period of "H" level of external /OE or /WE is provided, and a comparator compares the count of the counter with the threshold value in correspondence to the predetermined time. If the count is shorter than the predetermined time, the OR gate does not output burst refresh enable signal /B_REF.

Fourth Embodiment

Figure 17:
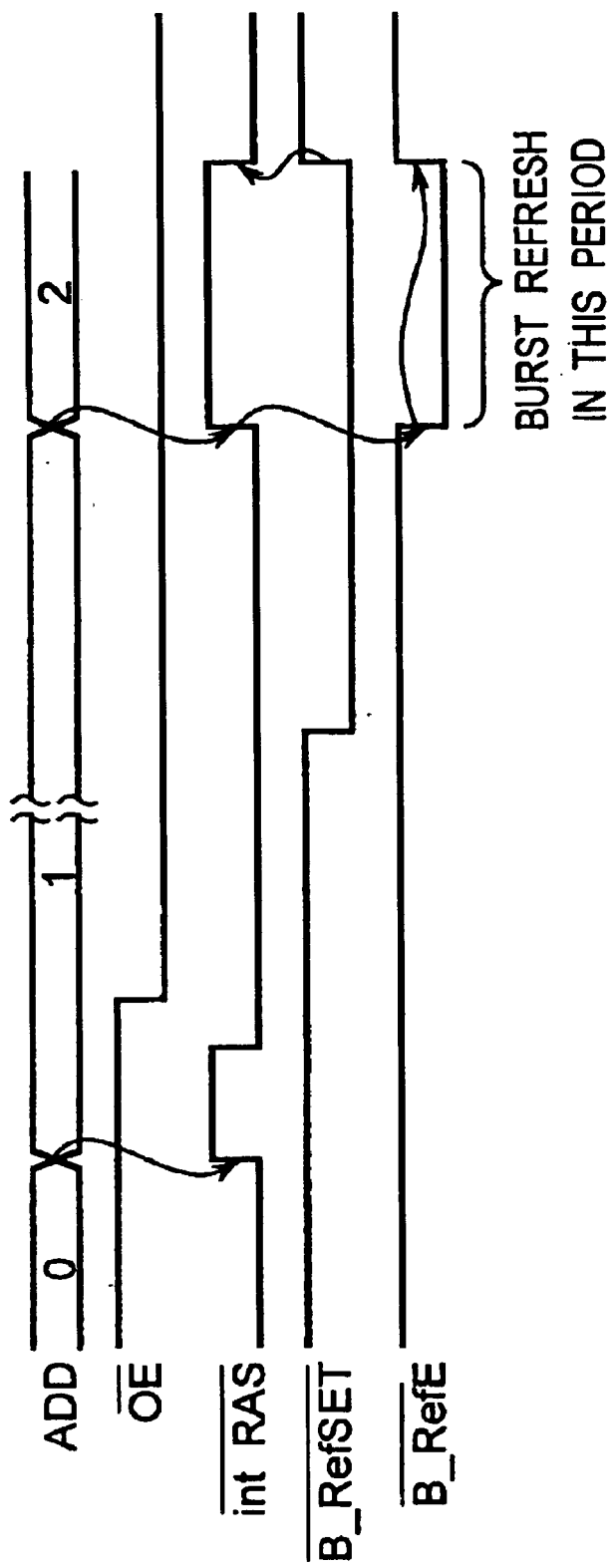
FIG. 17 is a timing chart on refresh control without any limitation on the period of "H" level of /OE or /WE after a long cycle.

When /OE is "H" level, in a long cycle, burst refresh is performed. However, it is needed to limit external timing in the period when /OE="H" level. Then, in the fourth embodiment, as shown in the timing chart of FIG. 17, when burst refresh is recognized to be needed in the state of /OE of "L" level (or burst refresh set signal /B_RefSET is activated), the row system is reset (int/RAS is enabled) based on address change of a next cycle irrespectively of /OE. Then, burst refresh enable signal /B_RefE is enabled to start burst refresh. When refresh operations of times skipped in a long cycle are completed in the burst refresh, int/RAS is activated to activate the row system for the next cycle. By synchronizing the timing for starting burst refresh with address change, the limitation of the period of /OE=H" level is not necessary, and the degree of freedom of external timing is increased. It is to be noted that this control can also be applied to a semiconductor memory device wherein the row system of the memory cell array 26 is controlled by a trigger of external /OE or /WE and to another semiconductor memory device of an address trigger type controlled by address change.

The structure of the refresh controller 40 is similar to that of the first embodiment (FIG. 4) except a burst refresh controller 400. In contrast to the circuit shown in FIG. 7, in the burst refresh controller 400, burst refresh set signal /B_RefSET (output signal of the flip flop 406) is activated, and when int/RAS is activated, the signal is sent to OR gate 410 to output burst refresh enable signal /B_RefE. For example, /B_RefSET and int/RAS signals are sent to the NOR gate, and its output signal is sent to the OR gate 410.

Fifth Embodiment

In the above-mentioned fourth embodiment, when a long cycle is recognized after the address is not changed for a long time, burst refresh is performed by deactivating the internal row system. However, because the burst refresh is performed at the next cycle, access delay occurs for the next cycle. In order to solve this problem, in the fifth embodiment, when a long cycle is recognized, the row system is deactivated automatically without waiting address change, and refresh window signal Refwin is activated. In this case, it is no problem to use normal refresh cycles tref. Thus, refresh window signal Refwin is activated, so that normal refresh operation is performed in synchronization with Refcyc (refer to FIG. 18). Burst refresh operations of times of skipped normal refresh operations are performed, and after the refresh operations are completed, the row system is activated again. Thus, refresh operations are performed in a long cycle, not in synchronization with leading edge of /OE. Therefore, the limitation on the period of /OE="H" level after the long cycle is not necessary, so that the freedom of external timing is increased.

Figure 18:
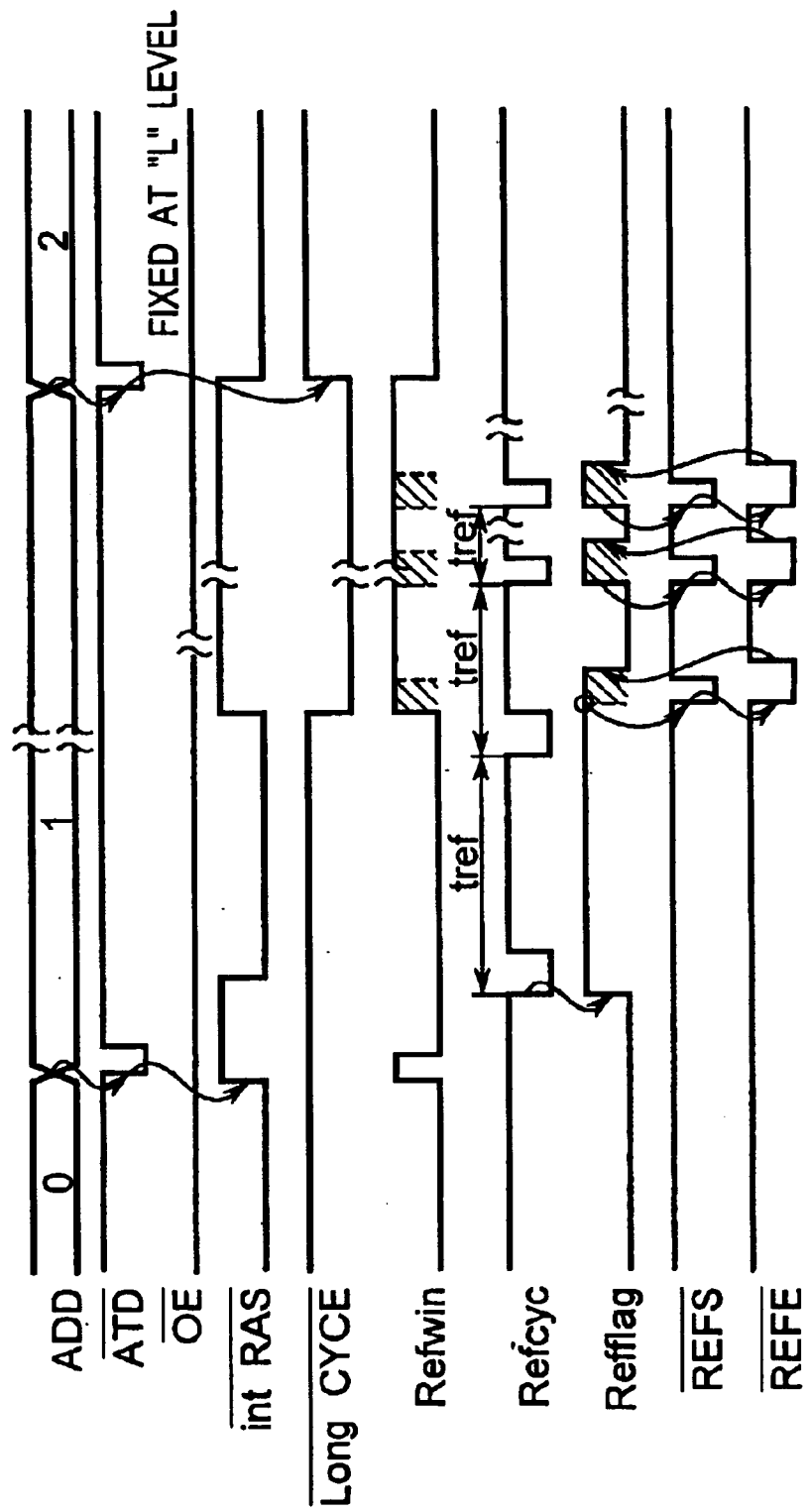
FIG. 18 is another example of a timing chart on refresh control without any limitation on the period of "H" level of /OE or /WE after a long cycle.
Figure 19:
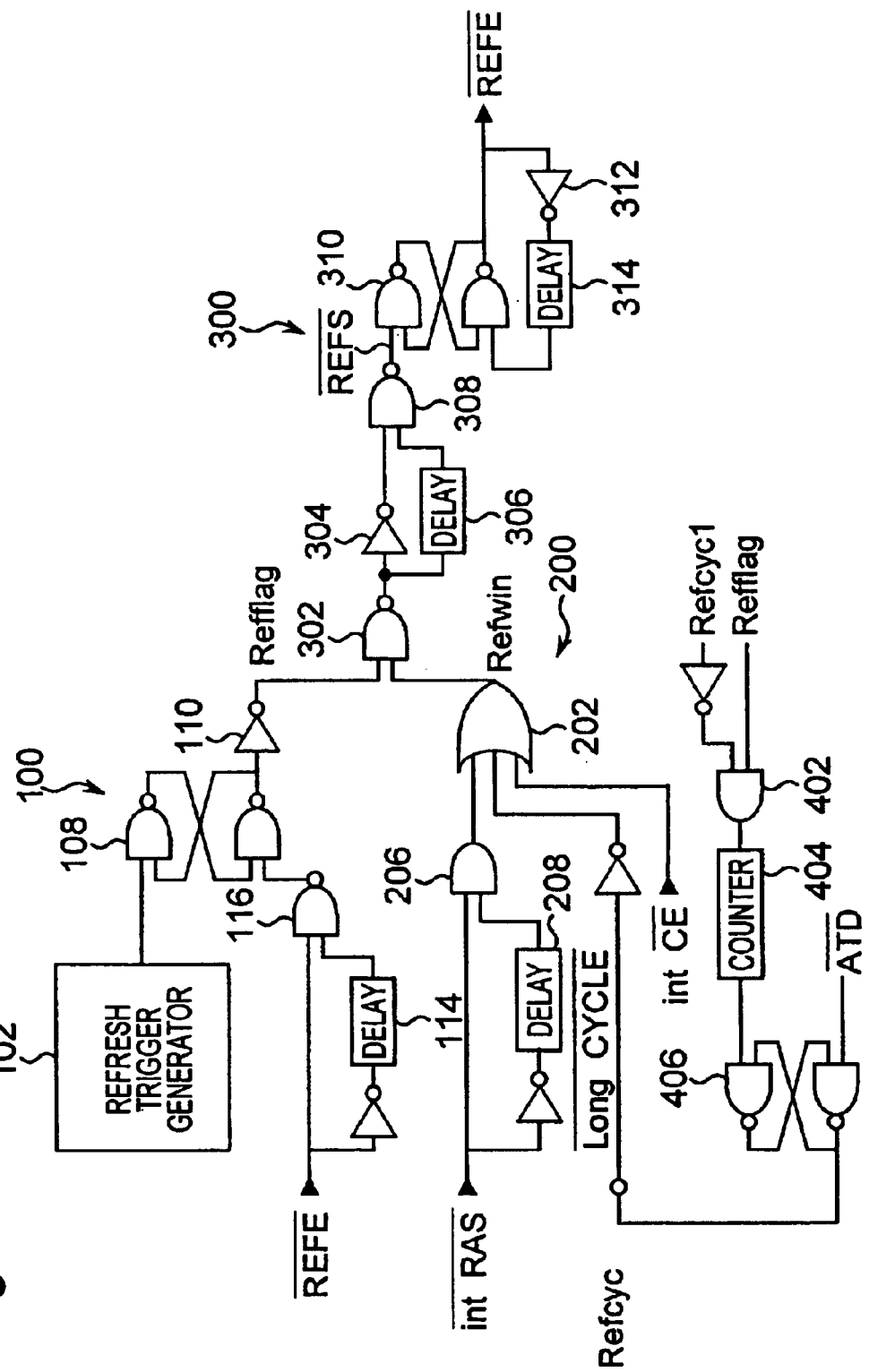
FIG. 19 is a circuit diagram which performs the processing shown in FIG. 18.

FIG. 19 shows the structure of the refresh controller 40 for the control shown in FIG. 18. In the refresh controller 40, the refresh flag controller 100 generates a signal (refresh flag Refflag) which represents whether the inside of the chip requests refresh operations or not. (The "H" level of Refflag means refresh request.) The refresh window generator 200 generates refresh window signal Refwin which represent a period when refresh operation can be performed. The circuit 300 generates refresh enable signal/REFE which controls refresh activation, based on refresh flag REfflag and refresh window signal Refwin. The burst refresh controller 400 controls burst refresh wherein refresh operations are performed together.

The refresh flag generator 100 has a normal refresh trigger generator 102 and a burst refresh trigger generator 104. The normal refresh trigger generator 102 includes a ring oscillator which generates refresh cycle (Refcyc1) of a predetermined period in normal time. Based on the refresh cycle signal Refcyc1, refresh flag Refflag is generated through a flip flop 108 and an inverter 110. Further, when refresh operation is completed, refresh flag Refflag is disabled. Thus the refresh enable signal /REFE is stopped to be outputted, and the generation of refresh flag is stopped after delay of a predetermined time. That is, the refresh enable signal /REFE itself and a signal obtained by transmitting /REFE signal through an inverter 112 and a delay circuit 114 are sent to an NAND gate 116, so that the output signal thereof resets the flip flop 108.

In the refresh window generator 200, when int/CE is "H" level, refresh window signal Refwin is always activated through the OR gate 202, while when int/CE="L" level, refresh window signal Refwin is activated in the burst refresh period (/B_RefE="L") through the OR gate 202. Further, when int/RAS is not active, refresh window signal Refwin is activated though the AND gate 206 by delaying a certain time by the delay circuit 208. Thus, burst refresh is performed in synchronization with fast refresh cycle Refcyc2.

The starting point of refresh operation is a timing when both of refresh flag Refflag set by refresh cycle signal Refcyc and refresh window signal Refwin are enabled. In a circuit 300 which generates refresh enable signal /REFE, both of refresh flag Refflag, set by refresh cycle signal Refcyc in the refresh flag generator 100, and refresh window signal Refwin, generated by the refresh window generator 300, are sent to a NAND gate 302. The output signal of the NAND gate 302 is sent directly or via a delay circuit 306 to an inverter 304 and further to a NAND gate 308, which outputs refresh start signal /REFS. The signal is outputted through a flip flop 310 as refresh enable signal /REFE. Refresh operation is performed according to the output of refresh enable signal /REFE. The signal /REFE is inverted by an inverter 312 and delayed by a delay circuit 314 by a refresh operation period. Then, it is sent to a flip flop 310 and is reset after a predetermined time.

The burst refresh controller 400 detects a long cycle automatically to set burst refresh. For the automatic detection of long cycle, when Refflag is activated (Refflag="H" level), the AND gate 402 sends inverted signal of Refcyc1, and it is counted by the counter 404. When the counter 404 counts twice or more, the occurrence of a long cycle is recognized. Then at the stage, the flip flop 406 is set to output long cycle signal /LONGCYCLE. Then, refresh window signal Refwin is enabled, and burst refresh is performed. On the other hand, the flip flop 406 is reset by signal /ATD on address change.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor memory device having an active state wherein data can be read and written and a standby state wherein the data are held, comprising:

a memory cell array including a plurality of memory cells arranged in a matrix;

a refresh controller which refreshes data stored in the plurality of memory cells;

wherein said refresh controller comprises:

a first refresh cycle generator which generates a first refresh cycle;

a second refresh cycle generator which generates a second refresh cycle having a period shorter than the first refresh cycle; and a refresh processor which performs refresh operation when refresh operation becomes possible after the first refresh cycle is generated by said first refresh cycle generator and, when refresh operation is not performed for a period longer than the first refresh cycle generated by said first refresh cycle generator, performs refresh operations successively based on the second refresh cycle generated by said second refresh cycle generator in the longer period or after the end of the longer period.

2. The semiconductor memory device according to claim 1, wherein said refresh processor comprises a detector which detects that refresh operation is not performed for the period longer than the first refresh cycle generated by said first refresh cycle generator.

3. The semiconductor memory device according to claim 2, wherein said detector comprises a counter which counts the first refresh cycle when refresh operation is requested, and the longer period is detected when said counter counts the first refresh cycle more than a predetermined times.

4. The semiconductor memory device according to claim 1, wherein said semiconductor memory device starts operation of internal row system of said memory cell array therein in correspondence to external output enable of write enable signal; wherein when refresh operation is not performed for the period longer than the first refresh cycle generated by said first refresh cycle generator due to a long active state of external output or write enable signal, said refresh controller performs refresh operation based on the second refresh cycle of times of skipped refresh operations based on the first refresh cycle while the external output enable or write enable signal is not active and the internal row system is not active.

5. The semiconductor memory device according to claim 4, wherein said refresh processor activates the continuous refresh operations based on the second refresh cycle after deactivation of external output or write enable signal, but does not the continuous refresh operations when the external output or write enable signal is activated within a time shorter than a predetermined time after the deactivation.

6. The semiconductor memory device according to claim 1, wherein said semiconductor memory device starts operation of internal row system of said memory cell array therein in correspondence to change in address; wherein when refresh operation is not performed for the period longer than the first refresh cycle generated by said first refresh cycle generator due to non-existence of change in address, said refresh controller performs refresh operation based on the second refresh cycle of times of skipped refresh operations based on the first refresh cycle while the external output or write enable signal is not active and the internal row system is not active.

7. The semiconductor memory device according to claim 6, wherein said refresh processor deactivates the internal row system of said memory cell array when refresh operation is not performed for the period longer than the first refresh cycle generated by said first refresh cycle generator due to non-existence of change in address.

8. The semiconductor memory device according to claim 6, wherein when the external output or write enable signal is deactivated while refresh operation is not performed for the period longer than the first refresh cycle due to non-existence of change in address, said refresh processor performs refresh operations based on the second refresh cycle of times of skipped refresh operations based on the first refresh cycle and activates again the internal row system of said memory cell array.

9. The semiconductor memory device according to claim 6, wherein said refresh processor activates the continuous refresh operations based on the second refresh cycle after deactivation of external output or write enable signal, but does not the continuous refresh operations when the external output or write enable signal is activated within a time shorter than a predetermined time after the deactivation.

10. The semiconductor memory device according to claim 1, wherein said second refresh cycle generator generates the second refresh cycle when refresh operation is not performed for the longer period than the first refresh cycle and refresh operation is performed.

11. The semiconductor memory device according to claim 1, wherein said semiconductor memory device activates the row system in said memory cell array in correspondence to change in address; wherein after recognizing that address is not changed for the period longer than the first refresh cycle, said refresh processor performs refresh operation based on the second refresh cycles of times of skipped refresh operations based on the first refresh cycles in correspondence to a next change in address.

12. The semiconductor memory device according to claim 1, wherein said semiconductor memory device starts operation of internal row system of said memory cell array therein in correspondence to change in address; wherein when refresh operation is not performed for the period longer than the first refresh cycle generated by said first refresh cycle generator due to non-existence of change in address, said refresh controller deactivates the row system of said memory cell array, performs refresh operations based on the second refresh cycle of times of skipped refresh operations based on the first refresh cycle, and activates again the row system of said memory cell array after completion of the refresh operations.

* * * * *